Figure 1C:
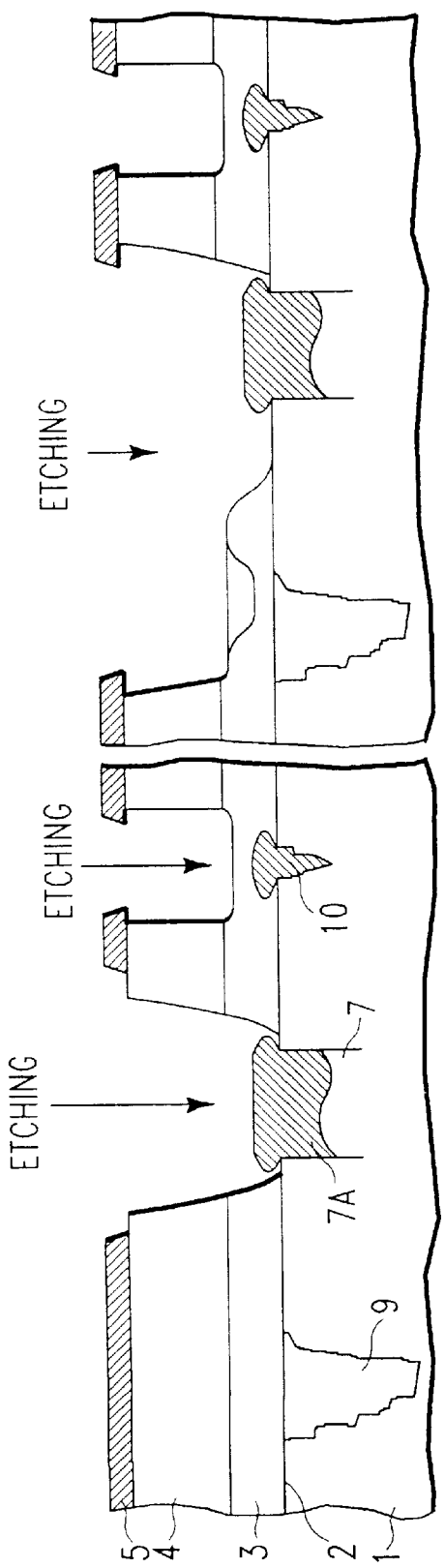

United States Patent [19]
Koblinger et al.

[11] Patent Number: 5,966,633
[45] Date of Patent: Oct. 12, 1999

[54] METHOD FOR PROVIDING A METALLIZATION LAYER ON AN INSULATING LAYER AND FOR OPENING THROUGH HOLES IN THE SAID INSULATING LAYER USING THE SAME MASK

[75] Inventors: Otto Koblinger, Korntal-Münchingen; Werner Stoffler, Tübingen, both of Germany

[73] Assignee: International Business Machines Corporation, Armonk, N.Y.

[21] Appl. No.: 08/700,472

[22] PCT Filed: May 23, 1995

[86] PCT No.: PCT/EP95/01960

§ 371 Date: Sep. 9, 1996

§ 102(e) Date: Sep. 9, 1996

[87] PCT Pub. No.: WO96/29729

PCT Pub. Date: Sep. 26, 1996

[30]     Foreign Application Priority Data

Mar. 17, 1995  [DE]  Germany ............... 195 09 231

[51] Int. Cl.[6] ................................................. H01L 21/44
[52] U.S. Cl. ................. 438/667; 438/690; 438/712; 438/940
[58] Field of Search ................... 438/667, 690, 438/712, 940

[56]                References Cited

U.S. PATENT DOCUMENTS

| | | | |
|---|---|---|---|
| 4,720,470 | 1/1988 | Johnson | 438/598 |
| 4,742,026 | 5/1988 | Vatus et al. | 438/712 |
| 4,807,022 | 2/1989 | Kazior et al. | 257/713 |

(List continued on next page.)

OTHER PUBLICATIONS

G.T. Chiu, et al., "Process for Multilayer Metal Technology", IBM TDB vol. 25, No. 10, Mar. 1983, pp. 5309–5314.
F. G. Bachmann, "Large Scale Industrial Application for Excimer–Lasers: Via–Hole–Drilling by Photo–Ablation", SPIE vol. 1361, 1990, pp. 505–511.
J. Palleau, et al., "Fabrication d'un reseau d'interconnexions haute densite pour modules avances multi–puces par une technique de lift–off", Journal De Physique, Apr. 1993, pp. 793–804 793–804.

*Primary Examiner*—John F. Niebling
*Assistant Examiner*—Lynne A. Gurley
*Attorney, Agent, or Firm*—Steven J. Soucar

[57]                ABSTRACT

A method for thin film or semiconductor technology, is discussed in which a metallization layer can be provided on an insulating layer, allowing opening of through holes in the insulating layer simultaneously with the same mask. A substrate 1 has a first 3 and a second 4 insulating layer on its surface 2, a cover layer 5 on the second insulating layer 4, a structured mask layer 6 on the cover layer 5, and through openings 7 filled with metal and extending from the rear side of the substrate as far as the substrate surface 2. The mask layer 6 features openings in the areas facing the through openings 7 and in the areas to be covered with a metal layer 8. The cover layer 5 is opened in the areas which are not covered by the structured mask layer 6 by means of a first etching process. Following this, the second insulating layer 4 is laser ablated in the areas facing the filled through openings 7, using dielectric mask. Then, a second etching process simultaneously opens the first insulating layer 3 in the areas facing the filled through openings 7, and the second insulating layer 4 in the areas to be covered with a metal layer 8, whereby the through openings 7 are completely freed from the first insulating layer 3, the second insulating layer 4 is completely removed in the areas which are to be covered with a metal layer 8, and the first insulating layer 3 is substantially retained on the substrate surface 2.

15 Claims, 7 Drawing Sheets

U.S. PATENT DOCUMENTS

| | | | |
|---|---|---|---|
| 4,818,724 | 4/1989 | Cetronio et al. | 438/606 |
| 5,111,278 | 5/1992 | Eichelberger | 257/698 |
| 5,173,442 | 12/1992 | Carey | 437/173 |
| 5,296,674 | 3/1994 | Praschek et al. | 219/121.69 |
| 5,304,511 | 4/1994 | Sakai | 438/577 |
| 5,391,516 | 2/1995 | Wojnarowski | 438/640 |
| 5,426,072 | 6/1995 | Finnila | 438/107 |
| 5,454,904 | 10/1995 | Ghezzo et al. | 216/13 |
| 5,462,897 | 10/1995 | Baum et al. | 216/18 |
| 5,518,956 | 5/1996 | Lin et al. | 438/4 |
| 5,524,339 | 6/1996 | Gorowitz et al. | 29/841 |
| 5,616,524 | 4/1997 | Wei et al. | 438/4 |
| 5,627,406 | 5/1997 | Pace | 257/700 |

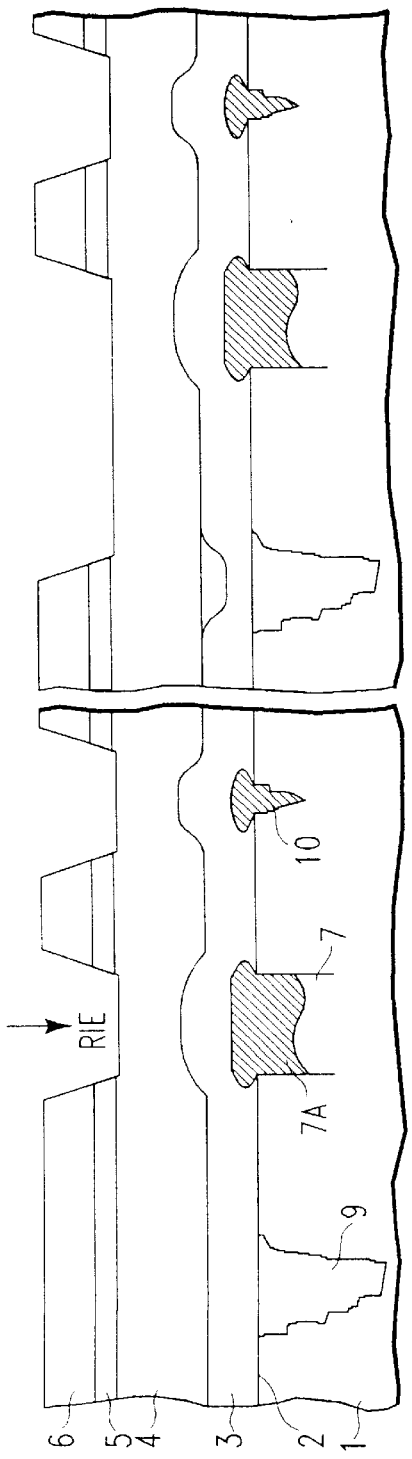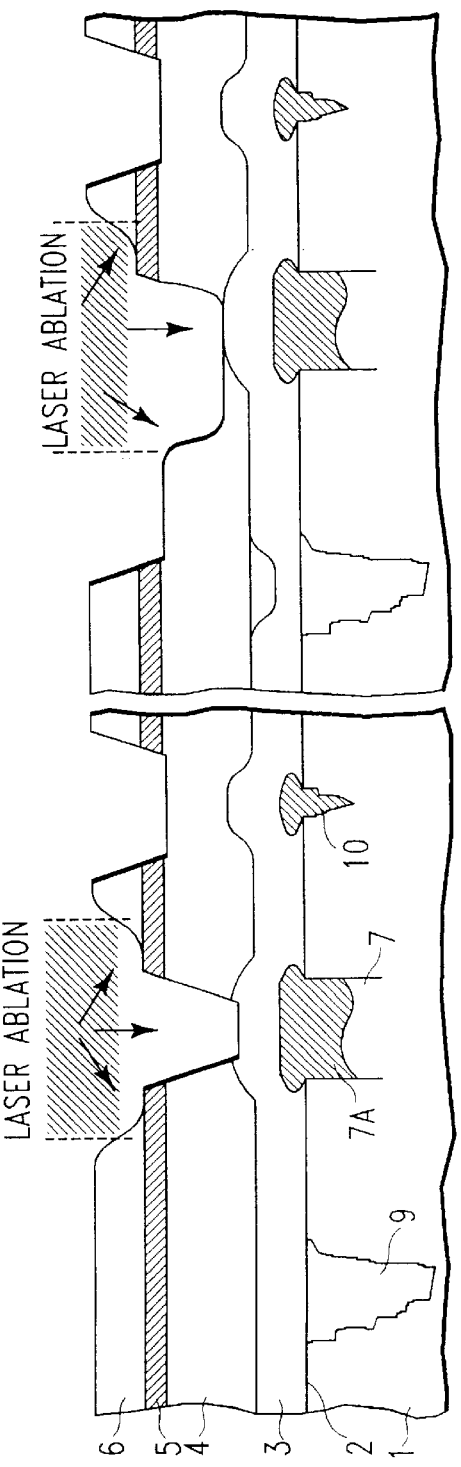

METHOD FOR PROVIDING A METALLIZATION LAYER ON AN INSULATING LAYER AND FOR OPENING THROUGH HOLES IN THE SAID INSULATING LAYER USING THE SAME MASK

The invention relates to a method whereby a metallization layer can be provided on an insulating layer, and whereby through holes can be opened in the said insulating layer simultaneously and with the same mask. A method of this sort can be used in the fields of thin film technology or semi-conductor technology, in particular for the thin film wiring of multiple layer ceramic substrates.

In thin film technology, it, is advantageous to work on a flat substrate. In this way, it is possible to avoid or at least to minimize faults during the metallization, in particular short circuits and holes in the substrate. In the case of a rough substrate, an attempt is usually made to correct this roughness by introducing an intermediate br planarising layer before the thin film is applied. This planarising layer can also be used as an insulating layer, in order to insulate desired and/or undesired metal residues from preceding processes on the surface of the subsequent metallization level. However, this planarising layer imposes additional requirements on the process sequence, since the electrical contacts to the substrate actually have to be opened first. Processes are feasible such as, for example, polishing back the planarising layer to the level of the substrate electrical contacts. Since the metallization of the substrate must not be damaged when this is done, it proves to be a very difficult process.

It is therefore more obvious to etch through openings into the insulating layer, and to fill these with metal. However, this again imposes very high requirements on the etching process, since flat flanks must be etched into the insulating layer for a continuous and reliable metallic connection over the through openings. If technical reasons mean that only steep edges are possible in the insulating layer, this makes it necessary to precipitate the metal and to polish back subsequently. In addition, there is the fact that—apart from the additional costs for this two-mask process (the formation of through openings and of metal conducting leads)—additional space is necessary for the adjustment and process tolerances, which increases the active area and reduces the yield.

Another decisive factor is the selection of the insulating material. Thus, due to the lack of an etching stop in the case of reactive ion etching with oxygen ions in the two mask process, use cannot be made of any organic insulating layer, such as polyimide, for subsequent detachment or lift-off processes.

A high temperature lift-off process for polyimide structures is described in the IBM Technical Disclosure Bulletin, Vol. 23, No. 6, November 1980, pages 2293/2294. A high temperature lift-off process of this sort requires etching in oxygen plasma and cannot therefore be executed on an unprotected polyimide surface, since the polyimide will also be attacked by this etching process. During the reactive ion etching, a thin layer of silicon nitride is therefore used as the etching stop.

It is the task of the invention to make a process available which enables the provision of a metallization layer on an insulating layer, and the opening of through holes in this layer by means of the same mask, and without the use of an etching stop layer.

A substrate is made available with a first and a second insulating layer on the surface of the substrate, a cover layer on the second insulating layer, a structured mask layer on the cover layer, and through openings filled with metal which extend from the rear side of the substrate as far as the surface of the substrate. The mask layer is structured in such a manner that it features openings in the areas facing the through openings and in the areas which are to be covered with a metal layer. In those areas which are not covered by the structured mask layer, the cover layer is opened by means of a first etch process. Following this, the second insulating layer is laser ablated in those areas located facing the filled through openings, with the use of a dielectric mask. After this, a second etch process simultaneously opens the first insulating layer in those areas located facing the filled through openings, and the second insulating layer in those areas which are to be covered with a metal layer, whereby the through openings are completely freed from the first insulating layer, the second insulating layer is completely removed in those areas which are to be covered with a metal layer, and the first insulating layer is substantially retained on the surface of the substrate.

In comparison with the known two-mask method, this one-mask method represents a major simplification of the method, and it guarantees that in those areas of the substrate surface which are to be covered with a metal layer, the said substrate surface is always covered with the first insulating layer and, therefore, that process-induced failures caused by faults during/in the-metallization are excluded to the greatest possible extent, and thus that the reliability of the subsequent end product is greatly increased. A further advantage of the method is that the edges of the second insulating layer can be etched steeply, since the metal leads only verge on to the insulating layer at the point where the outer limitation of the dielectric mask for the laser ablation ends, and the first insulating layer has a flat edge as a result of the subsequent etching step. Further advantageous developments are shown in the sub-claims.

Figure 2A:
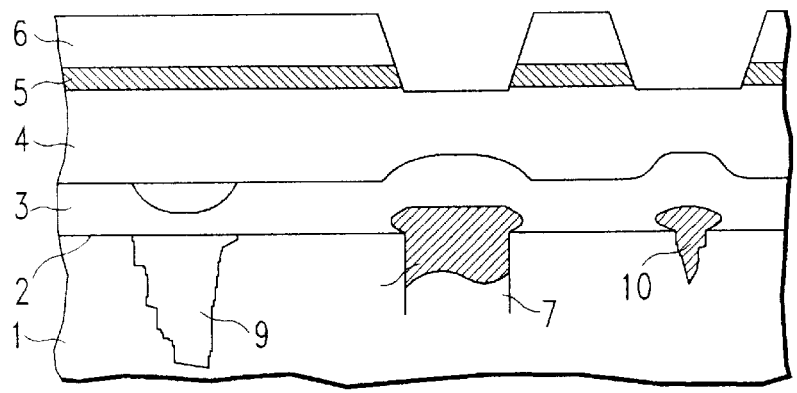
Figure 3A:
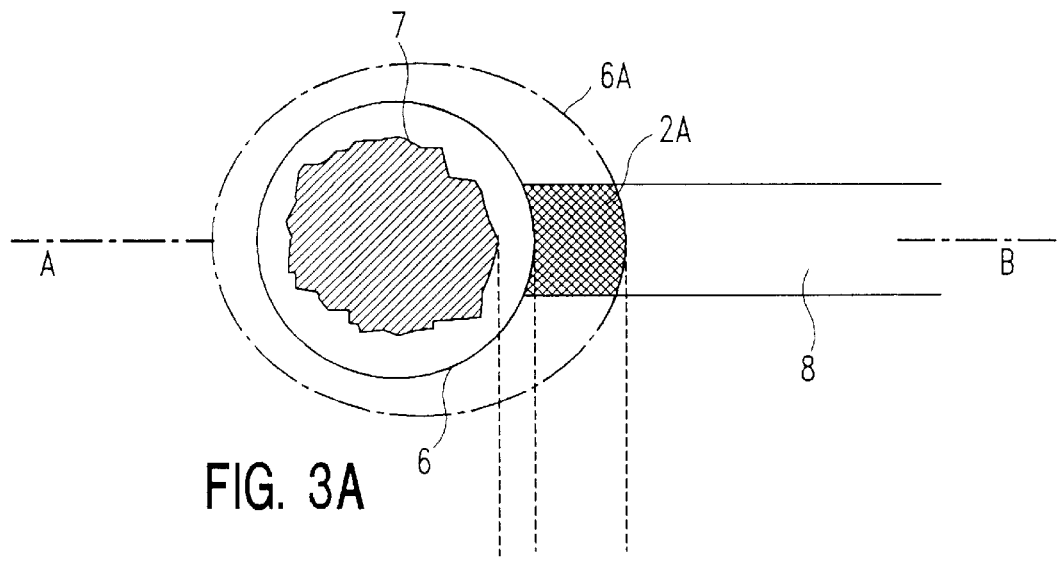
Figure 3B:
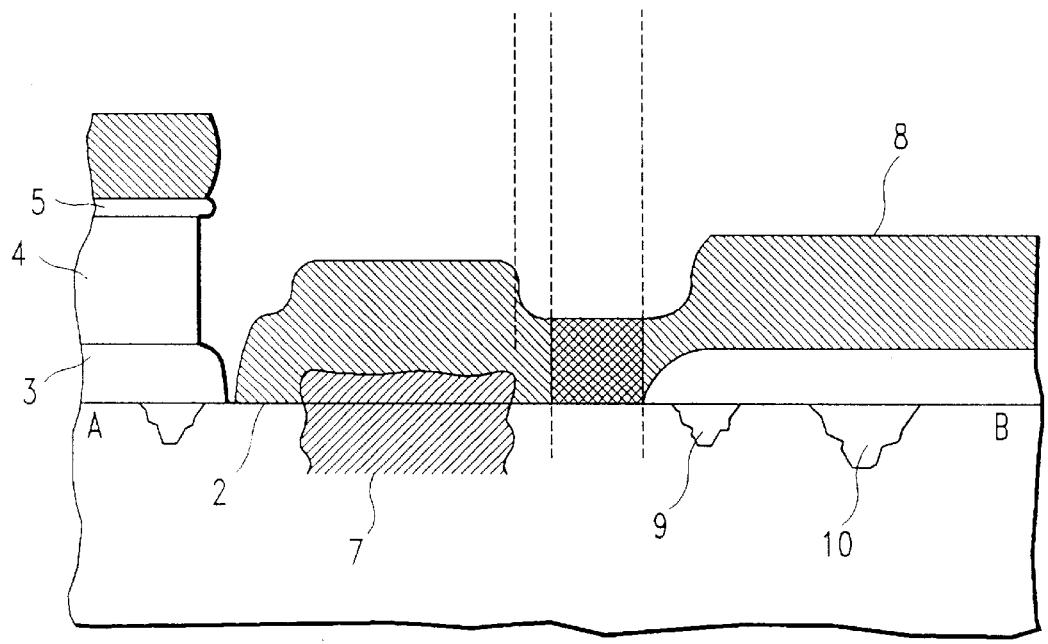
Figure 4A:
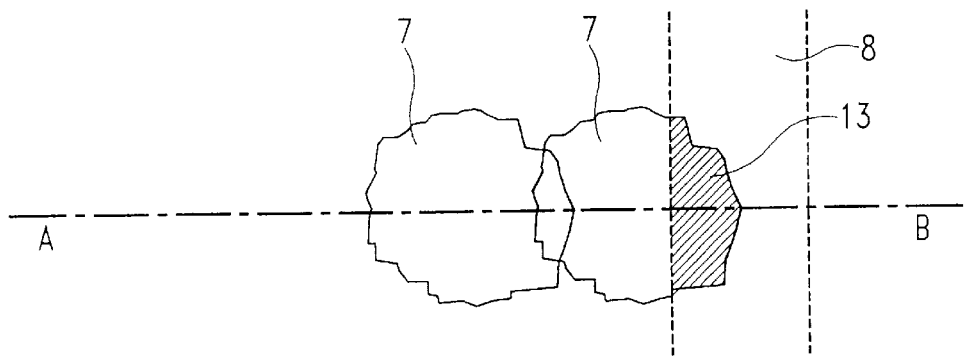
Figure 4B:
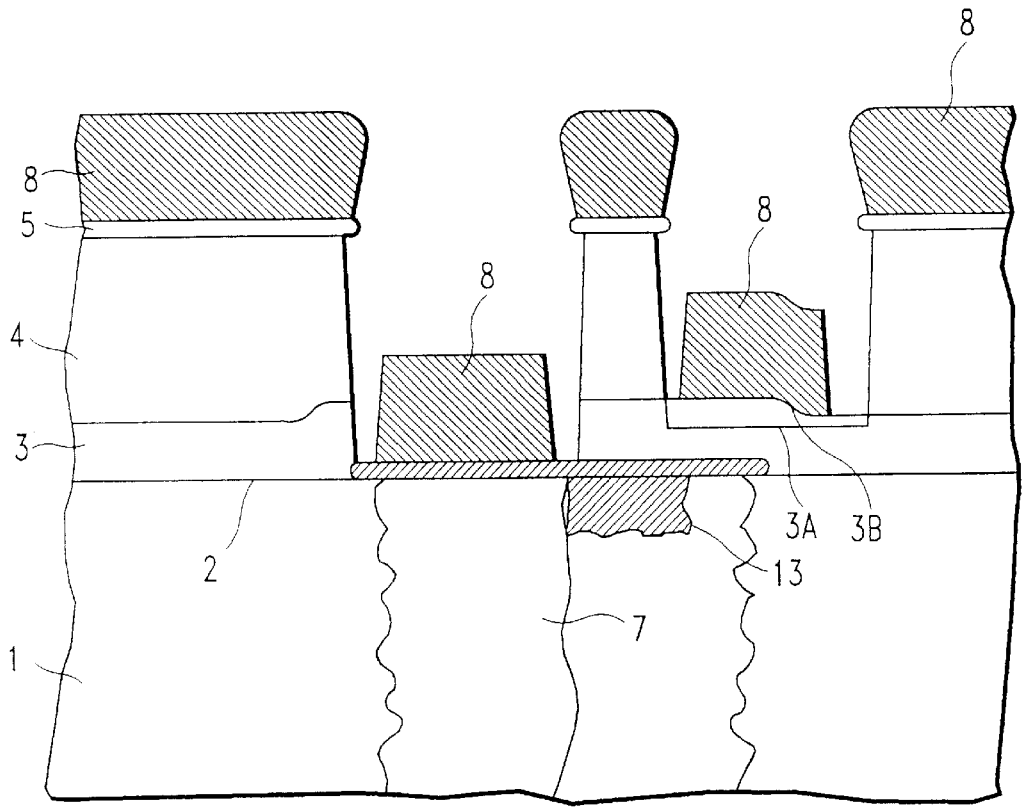
Figure 5A:
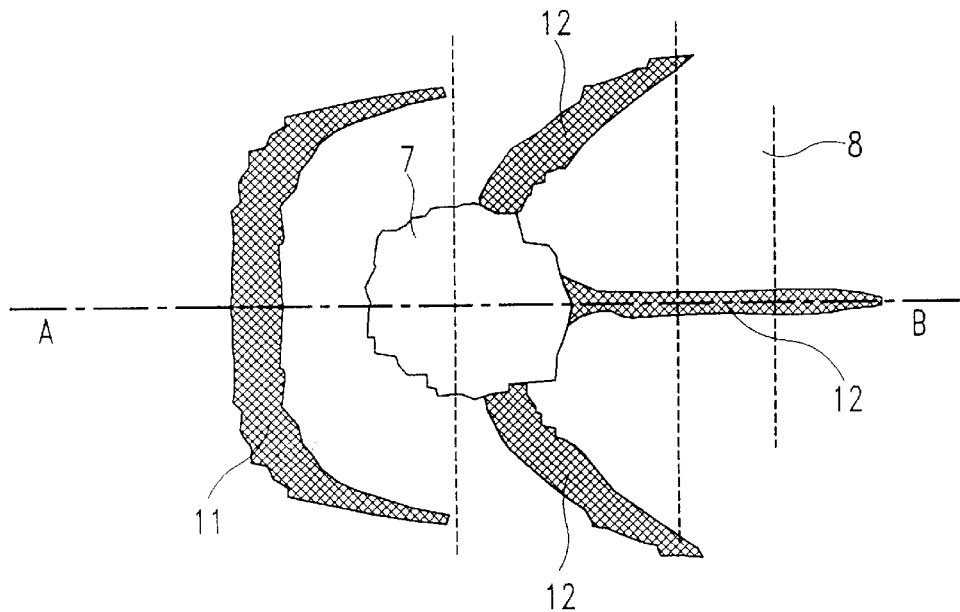
Figure 5B:
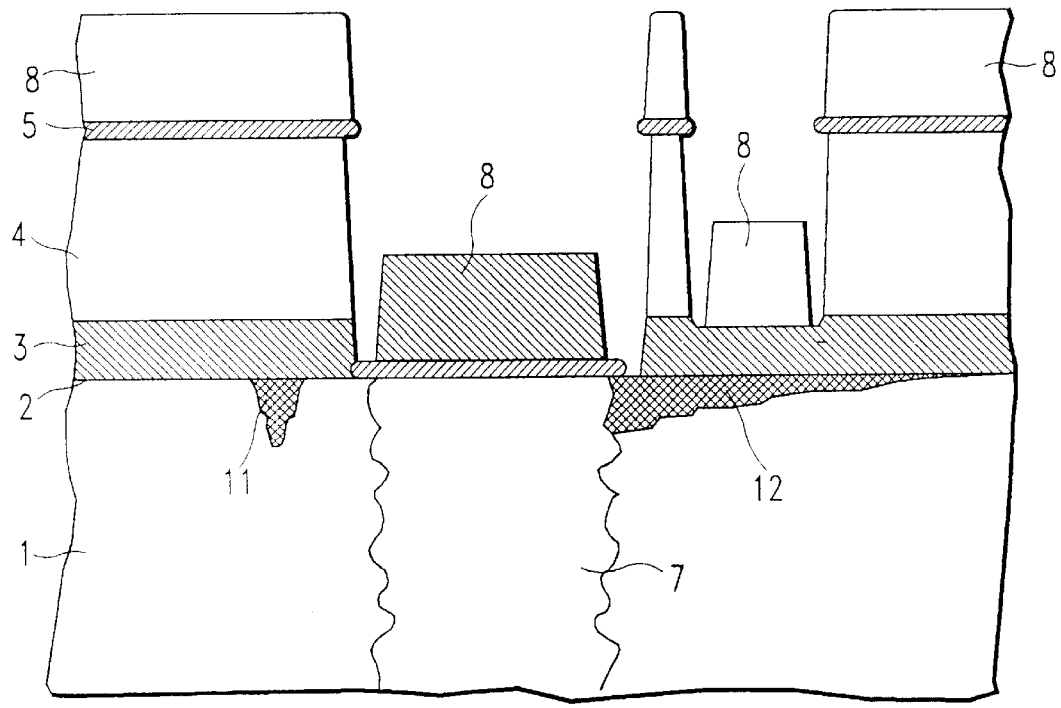

The invention is now described in detail, with the use of constructional examples, and with reference to illustrations which specifically show the following:

FIGS. 1a)–d) show the individual steps in the method according to the invention, with an organic layer as the first insulating layer;

FIGS. 2a)–e) show the individual steps of the method according to the invention, with an inorganic layer as the first insulating layer;

FIG. 3a) shows the surroundings of a through opening after the provision of a metal layer, in top view; and FIG. 3b) illustrates this in cross-section and, at the same time, shows an example of the good edge coverage of the insulating stage by the metal;

FIGS. 4a) and 5a) and FIGS. 4b) and 5b) respectively show top views and cross-section images of examples of fabrication problems which frequently arise and which are avoided thanks to the method according to the invention; in FIG. 4, these problems are short circuits in the area of the double through openings, and in FIG. 5, they are radial or C-shaped fissures in the substrate which are filled with metal.

FIG. 1a) shows a- substrate 1 with a first 3 and a second 4 insulating layer on the surface 2 of the substrate 1. The substrate may consist of a semiconductor metal, or may be a ceramic material such as aluminium oxide ceramic or glass ceramic. In this constructional example, the first insulating layer 3 is manufactured from organic material, preferably from polyimide, and the second insulating layer 4 also consists of organic material, and preferably of polyimide. Located over the second insulating layer 4-is a cover layer 5, which may consist of hexamethyldisilazane, silicon, silicon nitride, silicon oxide or also of a metal. On the cover layer 5, a structured mask layer 6 is provided according to the conventional photolithographic methods, and consisting suitably of a photosensitive resist. Through openings 7 filled with metal extend from the rear side of the substrate as far as the surface 2 of the substrate. In the area adjacent to the surface 2 of the substrate, the filling metal of the through openings 7 is covered with a plated-on metal layer 7a, which is preferably a layer of nickel. The mask layer 6 is structured in such a way that it features openings in the areas facing the through openings 7, and also in the areas which are later to be covered with a metal layer.

In the substrate 1, hole-like 9 and fissure-like 10 fault structures are indicated.

FIG. 1a) shows the state after the opening of the cover layer 5 in the areas which are not covered by the structured mask layer 6. The cover layer has been, removed in the desired areas by means of an etching process. For this purpose, a wet chemical etching,process or an etching with reactive ions, for example with CHF3, CF4 or C12/SF6 is equally suitable.

FIG. 1b) shows how, with the use of a dielectric mask, openings are created in the second insulating layer 4 by means of laser ablation the second insulating layer 4 in the areas located facing the filled through openings 7 and in the areas to be covered with a metal layer. The manner in which laser ablation is used to produce through holes in an organic layer, such as one made of polyimide, is shown, for example, in IBM Technical Disclosure Bulletin, Vol. 26, No. 7B, December 1983, pages 3586/3587, or also in IBM Technical Disclosure Bulletin Vol. 28, No. 5, October 1985, page 2034.

The openings of the dielectric mask are markedly larger than the openings in the considerably more precise mask 6, which defines and adjusts the openings to be created in the insulating layers 3 and 4 facing the through openings 7. However, the cover layer 5 is protected by the relatively thick mask layer 6, and it cannot be destroyed by the laser ablation.

In the areas which are later to be covered with a metal layer, the openings in the second insulating layer 4 are even somewhat more enlarged, so that a gentle angle is set in the edge area of the second insulating layer 4 and a sharp edge limitation by the edge of cover layer 5 is avoided. In this way, it is guaranteed that during the subsequent metal precipitation, the insulator stage will be covered by the metal without interruptions.

After the laser ablation step, a second etch step simultaneously opens both the first insulation layer 3 in the areas located facing the filled through openings 7, and also the second insulating layer 4 in the areas to be covered with a metal layer. FIG. 1c) shows the result of this etch step, which in particularly advantageous manner comprises an etching with reactive oxygen ions. The through openings have been completely freed from the first insulating layer 3 and in the areas to be covered with a metal layer, the second insulating layer 4 has been completely removed and the first insulating layer 3 has been partially removed on the substrate surface 2. An important result of this etch step is that the first insulating layer 3 is substantially retained on the substrate surface 2 in those areas which are not due to be directly coated with metal, even if, in order to ensure complete removal of the first insulating layer 3 from the through openings 7, a slight over-etching is intended. The advantage of the methodical sequence according to the invention is essentially that, as a result of the etching gain due to the laser ablation, the openings in the areas on the substrate surface which are to be covered with metal only penetrate laterally into the first insulation layer 3 to such an extent that an adequate layer thickness of the insulating material is still present over the substrate surface, but that the material of the second insulating layer 4 is reliably removed.

FIG. 3a) shows the surroundings of a through opening 7 after the application of a metal layer 8, in top view, and FIG. 3b) shows this in cross-section. Only the narrow shaded area 2a between the opening of the more precise mask 6 and the markedly larger opening of the dielectric mask 6a is unintentionally opened in the first insulating layer 3 during the second etch step. Small areas of this sort can be circumvented by adroit modification of the positioning of the conductor track 8 and the through opening 7 in critical areas. Even metal residues such as, for example, the radial-shaped or C-shaped fissures 11, 12 filled with metal in the substrate, shown in top view in FIG. 5a) and in cross-section in FIG. 5b), do not have a disruptive effect in these small areas, since they are in any case short-circuited by the metal conductor 8 which passes over them. It is only in those cases where the distance between the through opening 7 and the next metal line 8 is less than the differential difference 2a between the opening of the more precise mask 6 and the markedly larger opening of the dielectric mask 6a that the defects described can lead to failures because of short circuits. However, an accidental coincidence of a misalignment of the mask 6a in relation to mask 6 and the defects 11, 12 described above is extremely improbable.

Figure 1D:
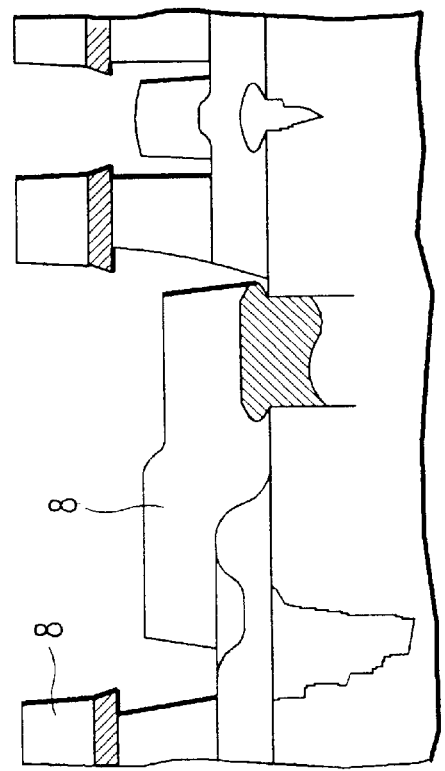

In FIG. 1d), the substrate has been vapour-coated with metal 8 and in the areas on the substrate surface and on the first insulating layer 3 which have been prepared for it by the preceding process steps, there is now only a metal layer 8.

Figure 2B:
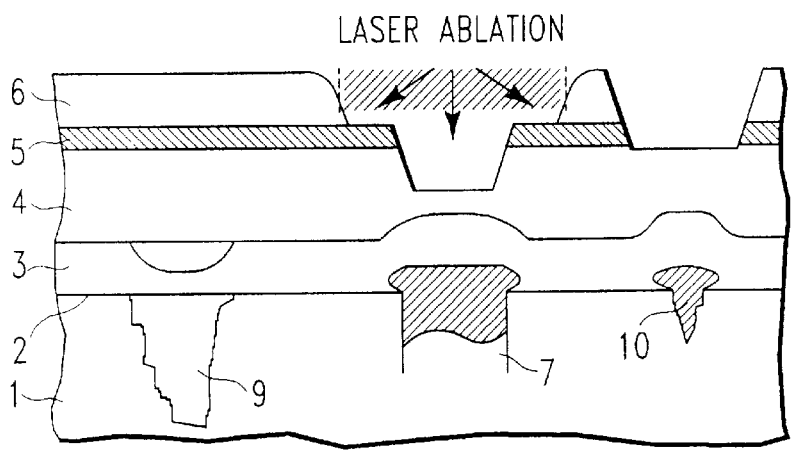
Figure 2C:
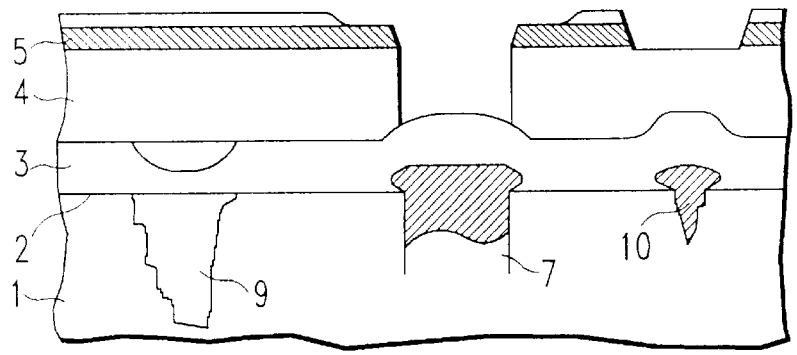
Figure 2D:
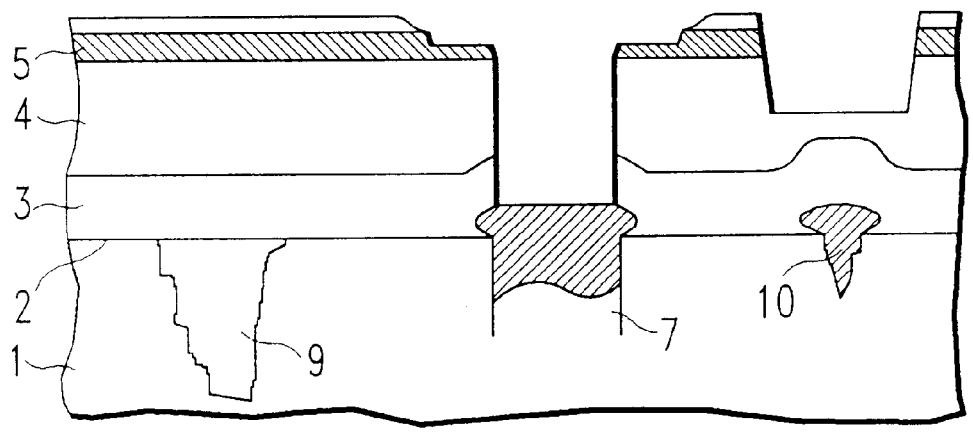

FIGS. 2a)–e) show the corresponding process sequence for the method according to the invention with an inorganic layer as the first insulating layer 3. The inorganic layer may, for example, consist of materials such as silicon oxide, silicon nitride or polysilicon. This method, shown in FIGS. 2a)–e), differs from the methodical sequence described above in that the laser ablation in FIG. 2b) does not completely remove the second insulating layer 4 in the areas located facing the filled through openings 7, and that the second etching process occurs in two sub-steps, whose respective sub-result is shown in FIGS. 2c)–2e). In the first sub-step of the second etching process, the second insulating layer 4 is completely removed in the areas located facing the filled through openings 7, FIGS. 2c) and 2d). In the subsequent second sub-step of the second etching process, the second insulating layer 4 is etched back laterally in such a manner that the cover layer 5 projects over the second insulating layer 4, FIG. 2e).

The first etching sub-step of the second etching process is preferably a wet chemical etching in several sequences, or an etching with reactive ions in several steps. As a result of these special etching techniques, of several wet etching sequences or multiple step etching with reactive ions, the subsequent passage of the metal line 8 on to the insulation layer 3 can be kept flat. The second etching sub-step of the second etching process is preferably an etching with reactive oxygen ions.

Figure 2E:
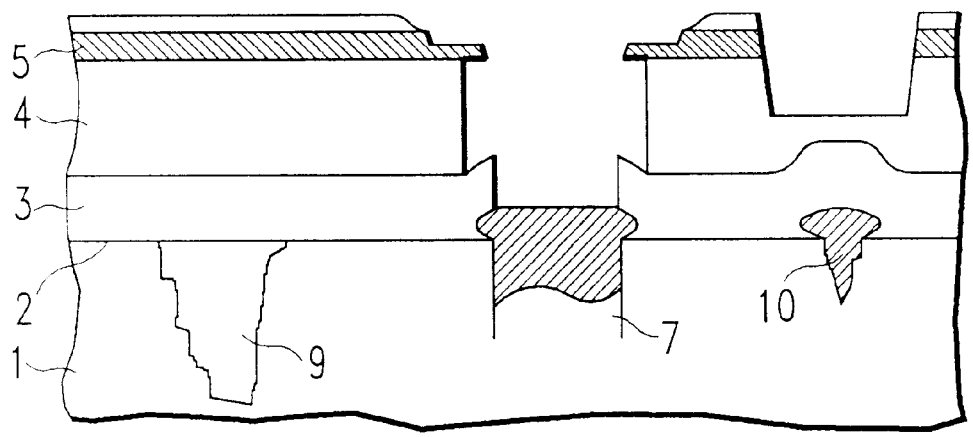

As indicated in FIG. 2e), it is possible that during the second etching sub-step, the cover layer 5 will be attacked to some extent. This can be minimized by a suitably coordinated choice of the insulation material, the material for the cover layer and the etching media.

Following the etching steps, the entire area of the substrate is vapour-coated with metal, just as in the first constructional example. The good edge coverage of the insulation stage by the metal 8 which is achieved with the methodical sequence according to the invention is shown by way of example in FIG. 3b).

In conclusion, the structures which are no longer required, consisting of the first 3 and the second 4 insulating layer and the cover layer 5 which has been vapour-coated with metal 8, are detached from the substrate surface 2, whereby the through openings 7 and the areas to be covered with a metal layer 8, over the first insulating layer 3 which is substantially retained, remain completely covered with metal 8.

This is a major advantage in comparison with the methods known hitherto, and it makes a causal contribution towards the maximum possible exclusion of process-induced failures resulting from faults during/in the metallization, such as (inter alia) the short circuits in the area of double through openings which are shown in FIGS. 4a) and 4b).

What is claimed is:

1. A method for providing a metallization layer on an insulating layer and for opening through holes in said insulating layer using the same mask, the method comprising the steps of:

providing a substrate with a first and a second insulating layer on the surface of the substrate, a cover layer on the second insulating layer, a structured mask layer on the cover layer, and with through openings filled with metal, extending from the rear side of the substrate as far as the surface of the substrate, whereby the mask layer is structured in such a way that it features openings in the areas facing the through openings and in the areas which are to be covered with a metal layer;

opening the cover layer in those areas which are not covered by the structured mask layer by means of a first etching process;

laser ablating the second insulating layer in the areas located facing the filled through openings, with the use of a dielectric mask; and simultaneously opening the first insulating layer in the areas located facing the filled through openings, and the second insulating layer in the areas to be covered with a metal layer, by means of a second etching process, whereby the through openings are completely freed from the first insulating layer, the second insulating layer is completely removed in the areas which are to be covered with a metal layer, and the first insulating layer is substantially retained on the surface of the substrate.

2. The method according to claim 1 wherein the structured mask layer on the cover layer comprises a structured photosensitive resist, and the cover layer is selected from the group consisting of hexamethyldisilazane, silicon, silicon nitride, silicon oxide, and metal.

3. The method according to claim 1 further comprising the steps of:

vapour-coating of the substrate with metal, and detaching from the substrate surface of the structure including the first and the second insulating layer and the cover layer which was vapour-coated with metal, whereby the through openings and the areas to be covered with a metal layer, over the first insulating layer which is substantially retained, remain completely covered with metal.

4. The method according to claim 1 in which the first etching process comprises an etching with reactive ions or wet chemical etching.

5. The method according to claim 4 wherein the reactive ions are selected from the group consisting of CHF3, CF4 or C12/SF6.

6. The method according to claims 1 wherein the second etching process is an etching with reactive oxygen ions.

7. The method according to one of claim 1 wherein the first insulating layer is an organic material.

8. The method according to claim 7 wherein the organic material is a polyimide.

9. The method according to claim 1 wherein the laser ablation does not completely remove the second insulating layer in the areas facing the filled through openings, and in which the second etching process takes place in two sub-steps.

10. The method according to claim 9 wherein in the first sub-step of the second etching process, the second insulating layer is completely removed in the areas located facing the filled through openings and in the second sub-step of the second etching process, the second insulating layer is etched back laterally in such a way that the cover layer projects over the second insulating layer.

11. The method according to claim 9 wherein the first sub-step of the second etching process comprises wet chemical etching or an etching with reactive ions in several steps, and in which the second sub-step of the second etching process is an etching with reactive oxygen ions.

12. The method according to claim 9 wherein the first insulating layer is an inorganic material.

13. The method according to claim 12 wherein the inorganic material is selected from the group consisting of silicon oxide, silicon nitride and polysilicon.

14. The method according to claim 9 wherein the structured mask layer on the cover layer comprises a structured photosensitive resist, and the cover layer is selected from the group consisting of hexamethyldisilazane, silicon, silicon nitride, silicon oxide, and metal.

15. The method according to claim 9 further comprising the steps of:

vapour-coating of the substrate with metal, and detaching from the substrate surface of the structure including the first and the second insulating layer and the cover layer which was vapour-coated with metal, whereby the through openings and the areas to be covered with a metal layer, over the first insulating layer which is substantially retained, remain completely covered with metal.

* * * * *